United States Patent
Kishi et al.

(10) Patent No.: US 10,347,774 B2
(45) Date of Patent: Jul. 9, 2019

(54) ELECTRODE PROVIDED WITH UBM STRUCTURE HAVING A BARRIER LAYER FOR REDUCING SOLDER DIFFUSION INTO THE ELECTRODE AND A METHOD FOR PRODUCING THE SAME

(71) Applicant: Siemens Aktiengesellschaft, Munich (DE)

(72) Inventors: Noriyuki Kishi, Okinawa (JP);
Tatsuhiro Koizumi, Okinawa (JP);
Hiroyuki Shiraki, Okinawa (JP);
Mitsuru Tamashiro, Okinawa (JP);
Masaya Yamamoto, Okinawa (JP)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 14/630,898

(22) Filed: Feb. 25, 2015

(65) Prior Publication Data
US 2015/0243801 A1    Aug. 27, 2015

(30) Foreign Application Priority Data
Feb. 27, 2014    (JP) .................................. 2014-037000

(51) Int. Cl.
*H01L 23/48*    (2006.01)
*H01L 23/52*    (2006.01)
(Continued)

(52) U.S. Cl.
CPC ........ *H01L 31/02005* (2013.01); *H01L 24/03* (2013.01); *H01L 24/12* (2013.01);
(Continued)

(58) Field of Classification Search
CPC ......... H01L 31/02005; H01L 27/14636; H01L 27/14638; H01L 24/03; H01L 31/0224;
(Continued)

(56) References Cited

U.S. PATENT DOCUMENTS

| | | | | |
|---|---|---|---|---|
| 7,164,158 B2* | 1/2007 | Stein | ...................... | H01L 33/40 257/433 |
| 2003/0189261 A1* | 10/2003 | Tong | ...................... | H01L 24/11 257/780 |
| 2005/0170634 A1* | 8/2005 | Lin | ...................... | H01L 23/522 438/622 |

FOREIGN PATENT DOCUMENTS

| | | |
|---|---|---|
| JP | S6419763 A | 1/1989 |
| JP | H02-139933 A | 5/1990 |

(Continued)

OTHER PUBLICATIONS

Abdelkader Aliane: "Developpement de bolometre refroidi ä 0,1 K pour use detection X dans la gamme 100 eV-10 keV"; These pour obtenir le grade de docteur de l 'Institut Polytechnique de Grenoble. Chapitre 3: Technologies de packaging du microcalorimetre; XP055054918; pp. 102-138;; 2009.

(Continued)

*Primary Examiner* — Duy T Nguyen
*Assistant Examiner* — Dilinh Nguyen
(74) *Attorney, Agent, or Firm* — Harness, Dickey & Pierce, P.L.C.

(57) ABSTRACT

A problem addressed by an embodiment of the present invention lies in providing a UBM structure which includes thin layers and can prevent diffusion of solder into an electrode. The UBM structure according to an embodiment of the present invention includes: a first UBM layer on an electrode, a second UBM layer on the first UBM layer, and a passivated metal layer between the first UBM layer and the (Continued)

second UBM layer. The passivated metal layer functions as a barrier layer with respect to solder diffusion.

6 Claims, 2 Drawing Sheets

(51) Int. Cl.
    *H01L 29/40* (2006.01)
    *H01L 31/02* (2006.01)
    *H01L 31/0296* (2006.01)
    *H01L 23/00* (2006.01)
    *H01L 31/0224* (2006.01)
    *H01L 27/146* (2006.01)

(52) U.S. Cl.
    CPC .. *H01L 27/14636* (2013.01); *H01L 27/14638* (2013.01); *H01L 31/0224* (2013.01); *H01L 31/0296* (2013.01); *H01L 2224/0401* (2013.01)

(58) Field of Classification Search
    CPC ............... H01L 24/12; H01L 31/0296; H01L 2224/0401; H01L 23/522; H01L 23/488; H01L 2225/06513; H01L 2225/06517; H01L 23/49838; H01L 2224/1302; H01L 2224/141; H01L 2224/161; H01L 2224/171; H01L 2224/211; H01L 2224/221; H01L 2224/2902; H01L 2224/301; H01L 2224/321; H01L 2224/13198; H01L 2224/13298; H01L 2224/29198; H01L 2224/29199; H01L 2224/29298
    USPC ...................... 257/746, 778, 786, 782, 784
See application file for complete search history.

(56) References Cited

FOREIGN PATENT DOCUMENTS

| | | | |
|---|---|---|---|
| JP | H07-283220 | A | 10/1995 |
| JP | 2001200362 | A | 7/2001 |
| JP | 2003174056 | A | 6/2003 |
| JP | 2005223057 | A | 8/2005 |
| JP | 2007-234660 | A | 9/2007 |
| JP | 2008-139124 | A | 6/2008 |
| JP | 2009182741 | A | 8/2009 |
| JP | 2011-222986 | A | 11/2011 |

OTHER PUBLICATIONS

Fiederle M. et al.: "Development of Flip-Chip Bonding Technology for (Cd,Zn)Te"; 2003 IEEE Nuclear Science Symposium Conference Record. Portland; [IEEE Nuclear Science Symposium Conference Record; New York NY IEEE; pp. 232-236; vol. 1; XP010740256; ISBN: 978-0-7803-8257-2;; 2003.
Extended European Search Report dated Jul. 27, 2015.
Abdelkader Aliane: "Developpement de bolometre refroidi ä 0,1 K pour use detection X dans la gamme 100 eV-10 keV"; These pour obtenir le grade de docteur de l 'Institut Polytechnique de Grenoble. Chapitre 3: Technologies de packaging du microcalorimetre; XP055054918 (Complete English Translation).
Japanese Office Action dated Dec. 26, 2017 issued in corresponding Japanese Application No. 2014-037000 with English translation.
Japanese Notice of Allowance dated Sep. 11, 2018 issued in corresponding Japanese Application No. 2014-037000 with English translation.

* cited by examiner

[Fig. 1]
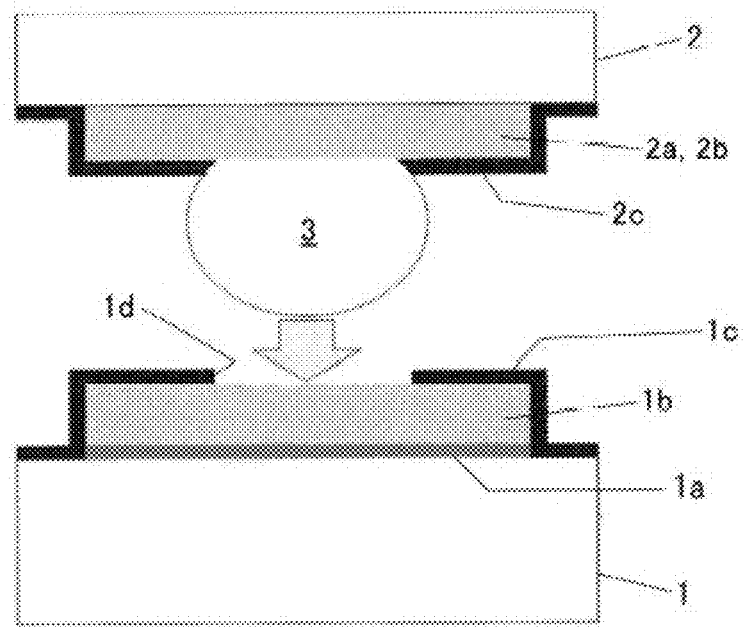
Prior Art
[Fig. 2]
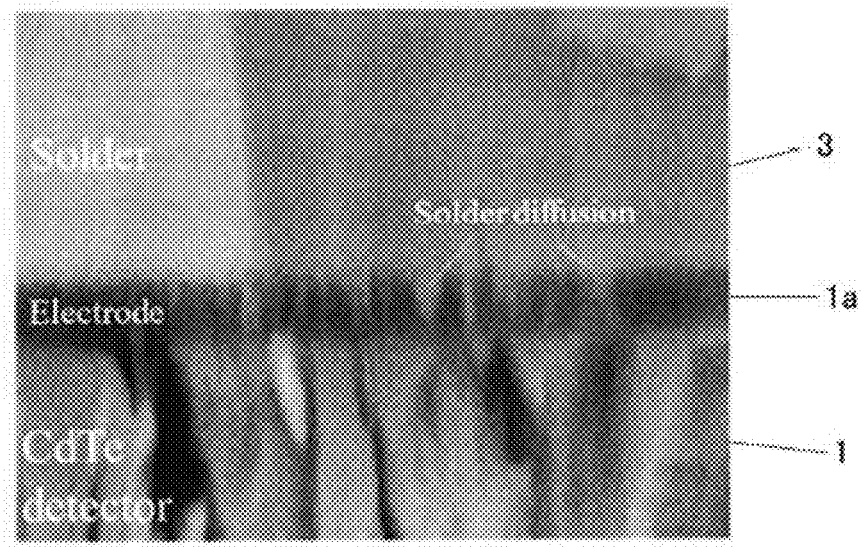
Prior Art

[Fig. 3]
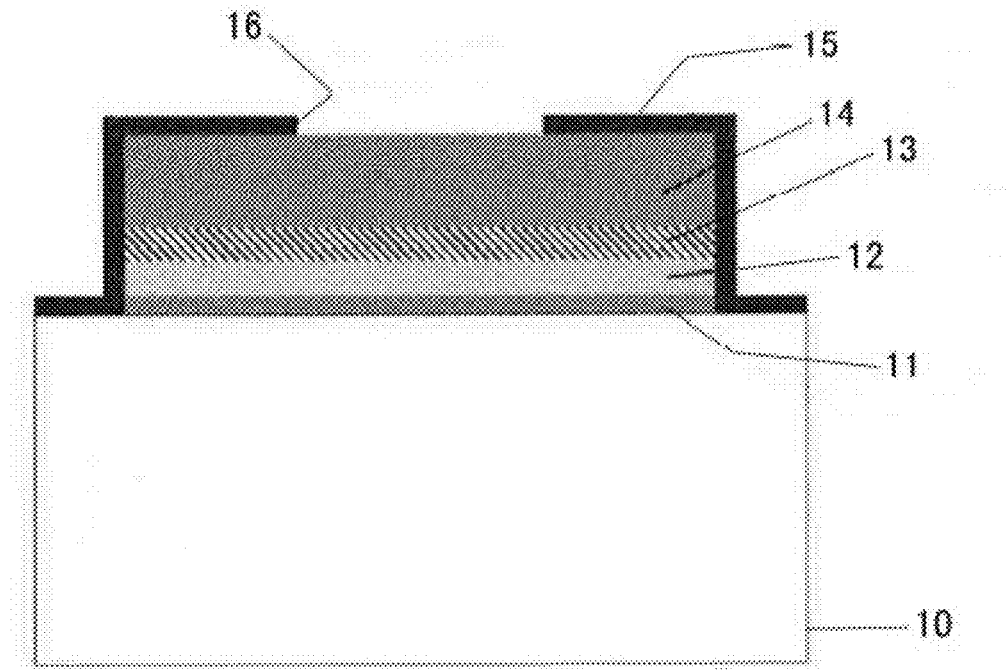
[Fig. 4]
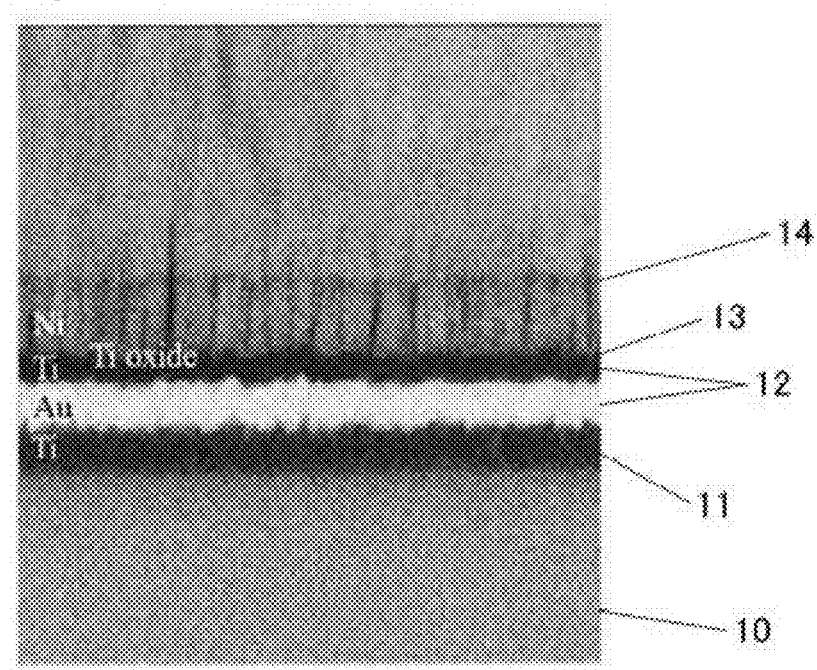

ELECTRODE PROVIDED WITH UBM STRUCTURE HAVING A BARRIER LAYER FOR REDUCING SOLDER DIFFUSION INTO THE ELECTRODE AND A METHOD FOR PRODUCING THE SAME

PRIORITY STATEMENT

The present application hereby claims priority under 35 U.S.C. § 119 to Japanese patent application number JP 2014-037000 filed Feb. 27, 2014, the entire contents of which are hereby incorporated herein by reference.

FIELD

The technology disclosed herein relates to UBM (under bump metallization or under bump metal) for bump bonding.

BACKGROUND

Bump bonding employing solder bumps, such as flip chip, is used for electronic component mounting involving electrical connections between a pixel-type CdTe detector (radiation detector) and a read-out circuit, for example. It is known that UBM is formed on connecting electrodes in bump bonding (Patent Document 1, for example).

FIG. 1 schematically shows the bump bonding process between a CdTe (cadmium telluride) detector 1 provided with existing UBM, and an ASIC 2 which is a read-out circuit thereof. A pixel-type electrode 1a employing Al (aluminum), Ti (titanium) or Pt (platinum) etc. is formed by way of vapor deposition or plating etc. on the surface of the CdTe detector 1. A UBM layer 1b comprising an Au/Ni/Au (gold/nickel/gold) composite layer is deposited by way of vapor deposition or the like on the electrode 1a. The thickness of the UBM layer 1b in this process (the thickness of the whole composite layer) is set at around several hundred nanometers. A protective passivation layer 1c is formed on the surface of the CdTe detector 1 on which the UBM layer 1b was formed. The passivation layer 1c has an opening 1d for exposing the UBM layer 1b for the purposes of bump bonding. The ASIC 2 is also provided with a pixel-type electrode 2a corresponding to the electrode 1a, a UBM layer 2b and a passivation layer 2c, and a solder bump 3 is formed in the opening of the passivation layer 2c.

The main aims in forming UBM are to form a connection between the solder bump and the electrode which is mechanically and electrically very stable, and to prevent diffusion of solder into the electrode. However, existing UBM structures do not adequately prevent solder diffusion. FIG. 2 is an SEM photograph showing the main parts in cross section of the UBM structure shown in FIG. 1 after bump bonding, and as can be seen, the UBM layer has been completely consumed and blended in with a solder bump 3, and ultimately the solder diffuses into the electrode 1a. Solder diffusion affects the performance of the CdTe detector and the reliability of the bump bonding connection.

[Patent Document 1] JP 2009-182741 A

SUMMARY

The use of a material having low wettability with respect to a solder bump, such as Ti or Ti alloy or Ni or Ni alloy at a thickness of several micrometers in the UBM layer is an effective way of preventing solder diffusion in the case of many semiconductor elements. However, when the UBM layer of a CdTe semiconductor element is thickened, even by a few micrometers, this increases stress and weakens adhesion, causing electrode peeling. That is to say, it is difficult to use this way of preventing solder diffusion with a CdTe semiconductor element, even though this is effective for other semiconductor elements.

In response to the abovementioned problem recognized by the inventors, at least one embodiment of the present invention proposes an electrode provided with a UBM structure having a barrier layer for restricting diffusion of solder into an electrode. Specifically, in at least one embodiment, this UBM structure comprises a first UBM layer, a second UBM layer on the first UBM layer, and a passivated metal layer between the first UBM layer and the second UBM layer. The passivated metal layer has sufficiently low wettability with respect to a solder bump, is several nanometers thick, and functions as a barrier layer.

According to one mode, the passivated metal layer in the UBM structure may be obtained as a metal oxide layer, metal nitride layer or metal oxynitride layer formed on the surface of the first UBM layer.

This kind of UBM structure may be produced by a method of at least one embodiment comprising: a step of forming a first UBM layer on an electrode; a step of passivating the surface of the first UBM layer to form a passivated metal layer; and a step of forming a second UBM layer on the passivated metal layer. According to one mode of at least one embodiment, the passivated metal layer may be formed by exposing the first UBM layer to an oxygen- or nitrogen-containing atmosphere in order to oxidize or nitride the surface of the first UBM layer.

The UBM structure of at least one embodiment provided herein makes it possible to adequately prevent diffusion of a solder bump into an electrode, even though the total thickness of the first UBM layer/passivated metal layer/second UBM layer is designed to be equivalent to the thickness of a conventional UBM layer in the abovementioned CdTe detector, for example; in other words the layers are thinner than in the prior art. At least one embodiment of the abovementioned structure can therefore also be readily used in a semiconductor element such as a CdTe detector. Furthermore, at least one embodiment of the structure can be produced by way of a simple method, which facilitates introduction into an existing production process.

BRIEF DESCRIPTION OF THE DRAWINGS

FIG. 1 is a schematic view in cross section illustrating a conventional UBM structure;

FIG. 2 is an SEM photograph of the UBM structure shown in FIG. 1 after bump bonding;

FIG. 3 is a schematic view in cross section showing a mode of embodiment of the UBM structure according to the present invention; and FIG. 4 is an SEM photograph of the UBM structure according to a mode of embodiment of the present invention after bump bonding.

DETAILED DESCRIPTION OF THE EXAMPLE EMBODIMENTS

Various example embodiments will now be described more fully with reference to the accompanying drawings in which only some example embodiments are shown. Specific structural and functional details disclosed herein are merely representative for purposes of describing example embodiments. The present invention, however, may be embodied in many alternate forms and should not be construed as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

Specific structural and functional details disclosed herein are merely representative for purposes of describing example embodiments of the present invention. This invention may, however, be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

In the following description, illustrative embodiments may be described with reference to acts and symbolic representations of operations (e.g., in the form of flowcharts) that may be implemented as program modules or functional processes include routines, programs, objects, components, data structures, etc., that perform particular tasks or implement particular abstract data types and may be implemented using existing hardware at existing network elements. Such existing hardware may include one or more Central Processing Units (CPUs), digital signal processors (DSPs), application-specific-integrated-circuits, field programmable gate arrays (FPGAs) computers or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

FIG. 3 shows an example embodiment of a UBM structure which is formed on a pixel-type electrode in a CdTe detector. A Ti electrode 11 is formed on the main surface of a CdTe detector 10. It should be noted that the Ti electrode 11 may equally be formed by Al or Pt. A composite-layer UBM structure formed by successively stacking a first UBM layer 12, passivated metal layer 13 serving as a barrier layer, and second UBM layer 14 is formed on the Ti electrode 11. Finally the main surface of the CdTe detector 10 is covered by a passivation layer 15, and the second UBM layer 14 is exposed through an opening 16 formed in the passivation layer 15. It should be noted that the ASIC serving as a read-out circuit and the solder bump are the same as in FIG. 1.

The passivated metal layer 13 held between the first UBM layer 12 and the second UBM layer 14 is a metal oxide layer or metal nitride layer, for example, and has low wettability with respect to the solder bump. The passivated metal layer 13 therefore functions as a barrier layer against solder diffusion. When the passivated metal layer 13 is a metal oxide layer, it is suitably formed by using a metal which is passivated and forms a thin oxide layer having a thickness of several nanometers on a metallic surface as a result of exposure to an oxygen-containing atmosphere such as atmospheric air, in other words materials such as Ti, Al, Cr (chromium) and Ni. If these metals are used in the first UBM layer 12, it is possible to obtain a passivated metal layer 13 by oxidizing (or nitriding) the surface of the first UBM layer 12 in order to form a metal oxide layer (metal nitride layer).

In order to suitably form the passivated metal layer 13, a passivation treatment involving this kind of atmospheric exposure may be easily introduced into the production process, but alternatively it may be formed by metal surface oxidation employing plasma treatment, or sputtering employing a metal oxide target, etc. Various methods may likewise be used when a metal nitride layer is employed as the passivated metal layer 13.

The production method will be described below through a specific example.

The Ti electrode 11 is formed to a thickness of several tens of nanometers on the main surface of the CdTe detector 10 by way of vapor deposition, sputtering or plating etc. The first UBM layer 12 is formed on the Ti electrode 11. According to this example, the first UBM layer 12 is formed as an Au/Ti composite layer in which an Au layer and a Ti layer are stacked in succession on the Ti electrode 11. The Au layer and Ti layer are deposited by way of vapor deposition to a thickness of several tens of nanometers.

The passivated metal layer 13 is formed by passivating the surface of the first UBM layer 12. In this example, the first UBM layer 12 is exposed to an oxygen-containing atmosphere (atmospheric air) in order to oxidize the surface and form a metal oxide layer, whereby the passivated metal layer 13 is formed. The first UBM layer 12 in this example is an Au/Ti composite layer, so the surface of the Ti layer at the upper layer is oxidized as a result and a Ti oxide layer is formed. The surface of the Ti layer is readily oxidized by the exposure and a Ti oxide layer having a thickness of several nanometers is formed as the passivated metal layer 13.

The second UBM layer 14 is formed on the passivated metal layer 13 formed in this way. The second UBM layer 14 in this example is formed as an Ni/Au composite layer in which an Ni layer and an Au layer are stacked in succession. The Ni layer and Au layer are formed to a thickness of several tens of nanometers by way of vapor deposition or sputtering.

The total layer thickness of the UBM structure comprising the abovementioned first UBM layer 12, passivated metal layer 13 and second UBM layer 14 is several hundred nanometers, and preferably around 200 nm-600 nm. That is to say, the abovementioned thickness is comparable with the thickness of a conventional UBM structure.

FIG. 4 is an SEM photograph of the UBM structure according to this mode of embodiment of the present invention after bump bonding. In the SEM photograph of the prior art shown in FIG. 2 mentioned above, the UBM layer reacts as a whole and blends in with the solder bump, and as a result solder diffuses into the electrode. On the other hand, in the case of FIG. 4, the passivated metal layer 13 comprising a Ti oxide layer functions as an effective barrier layer, and it can be confirmed that diffusion of solder into the Ti electrode 11 is adequately prevented.

It should be noted that the first UBM layer 12 in the abovementioned description may be formed as an Au/Al, Au/Cr or Au/Ni composite layer, instead of an Au/Ti composite layer. In this case, the passivated metal layer 13 is formed as an Al, Cr or Ni oxide layer, respectively.

Even though the UBM structure according to this mode of embodiment is designed in such a way that the total layer thickness of the first UBM layer 12/passivated metal layer 13/second UBM layer 14 is equally as small as that of a conventional structure, it is possible to adequately prevent diffusion of solder into the electrode 11. The abovementioned structure can therefore also be readily used in a semiconductor element such as a CdTe detector. Furthermore, the structure can be produced by way of a simple method, which facilitates introduction into an existing production process.

The present invention can be applied to a CdTe alloy such as $Cd_xZn_{1-x}Te$ ($0 \leq x \leq 1$) or $Cd_xMn_{1-x}Te$ ($0 \leq x \leq 1$), and can also be applied to UBM structures in various types of electronic components for which bump bonding is employed.

KEY TO SYMBOLS

10 CdTe detector
11 Electrode
12 First UBM layer
13 Passivated metal layer
14 Second UBM layer
15 Passivation layer
16 Opening The patent claims filed with the application are formulation proposals without prejudice for obtaining more extensive patent protection. The applicant reserves the right to claim even further combinations of features previously disclosed only in the description and/or drawings.

The example embodiment or each example embodiment should not be understood as a restriction of the invention. Rather, numerous variations and modifications are possible in the context of the present disclosure, in particular those variants and combinations which can be inferred by the person skilled in the art with regard to achieving the object for example by combination or modification of individual features or elements or method steps that are described in connection with the general or specific part of the description and are contained in the claims and/or the drawings, and, by way of combinable features, lead to a new subject matter or to new method steps or sequences of method steps, including insofar as they concern production, testing and operating methods.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

Further, elements and/or features of different example embodiments may be combined with each other and/or substituted for each other within the scope of this disclosure and appended claims.

Still further, any one of the above-described and other example features of the present invention may be embodied in the form of an apparatus, method, system, computer program, tangible computer readable medium and tangible computer program product. For example, of the aforementioned methods may be embodied in the form of a system or device, including, but not limited to, any of the structure for performing the methodology illustrated in the drawings.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. An electrode comprising:
    an under bump metal (UBM) structure including,
        a first UBM layer formed on the electrode;
        a second UBM layer; and
        a passivated metal layer formed in between the first UBM layer and the second UBM layer to function as a barrier layer for restricting diffusion of solder into the electrode;
    the first UBM layer being a composite layer which is any one of Au/Ti, Au/Al, Au/Cr and Au/Ni;
    the passivated metal layer being formed on a surface of the first UBM layer from an exposure of the surface of the first UBM layer to an atmosphere containing at least one of oxygen or nitrogen in order to at least one of oxidize or nitride the surface of the first UBM layer so as to form the passivated metal layer, such that the passivated metal layer formed as the barrier layer is one of,
        a metal oxide layer which is any one of $TiO_x$, $AlO_x$, $CrO_x$, and $NiO_x$,
        a metal nitride layer which is any one of $TiN_x$, $AlN_x$, $CrN_x$, and $NiN_x$, and
        a metal oxynitride layer which is any one of $TiO_xN_y$, $AlO_xN_y$, $CrO_xN_y$ and $NiO_xN_y$ (where $0<x$ and $0<y$); and
    the second UBM layer being an Ni/Au composite layer directly contacts the passivated metal layer.

2. A detector comprising the electrode of claim 1.

3. The detector of claim 2, wherein the detector is a CdTe detector.

4. The electrode of claim 1, wherein a surface of the second UBM layer is exposed through an opening in a passivation layer forming a protective coating over the UBM structure.

5. The electrode of claim 1, wherein:
    the UBM structure has a total thickness in a range of 200 nanometers to 600 nanometers, and
    the passivated metal layer formed in between the first UBM layer and the second UBM layer is relatively thin in comparison to the first UBM layer and the second UBM layer.

6. An under bump metal (UBM) structure comprising:
    a first UBM layer formed on an electrode;
    a second UBM layer; and
    a passivated metal layer formed in between the first UBM layer and the second UBM layer to function as a barrier layer for restricting diffusion of solder into the electrode,
    the first UBM layer being a composite layer which is any one of Au/Ti, Au/Al, Au/Cr and Au/Ni;
    the passivated metal layer being formed on a surface of the first UBM layer from an exposure of the surface of the first UBM layer to an atmosphere containing at least one of oxygen or nitrogen in order to at least one of oxidize or nitride the surface of the first UBM layer so as to form the passivated metal layer, such that the passivated metal layer formed as the barrier layer is one of,
        a metal oxide layer which is any one of $TiO_x$, $AlO_x$, $CrO_x$, and $NiO_x$,
        a metal nitride layer which is any one of $TiN_x$, $AlN_x$, $CrN_x$, and $NiN_x$, and
        a metal oxynitride layer which is any one of $TiO_xN_y$, $AlO_xN_y$, $CrO_xN_y$ and $NiO_xN_y$ (where $0<x$ and $0<y$); and
    the second UBM layer being an Ni/Au composite layer directly contacts the passivated metal layer.

* * * * *